United States Patent [19]
Shmunis

[11] Patent Number: 5,166,863
[45] Date of Patent: Nov. 24, 1992

[54] LIQUID-COOLED ASSEMBLY OF HEAT-GENERATING DEVICES AND METHOD FOR ASSEMBLING AND DISASSEMBLING

[75] Inventor: Gregory Shmunis, San Carlos, Calif.

[73] Assignee: Amdahl Corporation, Sunnyvale, Calif.

[21] Appl. No.: 730,346

[22] Filed: Jul. 15, 1991

[51] Int. Cl.⁵ .............................................. H05H 7/20
[52] U.S. Cl. ..................................... 361/385; 165/80.4; 174/16.3; 361/382; 257/714
[58] Field of Search ............... 165/80.3, 80.4, 185; 174/16.3; 357/81, 82; 361/382, 385–389

[56] References Cited

U.S. PATENT DOCUMENTS

| | | |
|---|---|---|
| 4,561,040 | 12/1985 | Eastman et al. ............... 361/385 |
| 4,977,444 | 12/1990 | Nakajima et al. .............. 361/382 |
| 5,006,924 | 4/1991 | Frankeny et al. .............. 361/385 |
| 5,043,797 | 8/1991 | Lopes .......................... 361/385 |

Primary Examiner—Gregory D. Thompson
Attorney, Agent, or Firm—Fliesler, Dubb, Meyer & Lovejoy

[57] ABSTRACT

A liquid-cooled assembly of heat-generating devices which are mounted on an electrical interconnect structure. A hydraulic interconnect structure transfers coolant between coolant chambers associated with the heat-generating devices. Flexible tubular members form inlets and outlets of the coolant chambers. The flexible tubular mewmbers are radially flexible and axially rigid, and hydraulic interconnect structure is sealed to the tubular members by radially compressed hydraulic seals.

21 Claims, 4 Drawing Sheets

LIQUID-COOLED ASSEMBLY OF HEAT-GENERATING DEVICES AND METHOD FOR ASSEMBLING AND DISASSEMBLING

CROSS-REFERENCE TO RELATED APPLICATION

LIQUID COOLED INTEGRATED CIRCUIT ASSEMBLY, Inventors Tom A. Oudijk and Gregory Shmunis, application Ser. No. 426,093, filed Oct. 24, 1989.

BACKGROUND OF THE INVENTION

1. Field of the Invention

The present invention relates to a cooling system for heat-generating devices; more particularly, to a liquid-cooled assembly which can effectively remove heat from a plurality of electrical heaters, for example, integrated circuits.

2. Description of the Related Art

One example of a conventional liquid-cooled integrated circuit assembly is disclosed in U.S. Pat. No. 4,644,385. As shown in FIG. 1, this assembly includes a wiring substrate 100 and a plurality of integrated circuits 102 mounted on the wiring substrate 100 by solder terminals 104. The integrated circuits 102 are arranged in a series of rows and are supported and electrically interconnected by the wiring substrate 100. A cooling member 106 is attached to each integrated circuit 102. Liquid coolant is provided to a cooling module 108 and is transferred to and from the cooling module 108 and the cooling members 106 via flexible pipes 110 (i.e., bellows). The bellows 110 have sufficient flexibility in the direction normal to the longitudinal axis of the bellows (radial flexibility) to absorb accumulated misalignment tolerances between the cooling members and the cooling module. Heat generated by the integrated circuits 102 is transferred from the integrated circuit to cooling members 106 via a thermal joint and then into the coolant which passes to the various cooling members 106 in series.

One problem associated with this conventional integrated circuit assembly is that the bellows 110 are expensive both from a materials and a labor standpoint. Further, mechanical pressure may be placed on the wiring substrate 100 by the bellows 110. The pressure applied to the wiring substrate 100 by the bellows 110 results in reliability problems associated with stresses in the wiring substrate 100.

In addition, the bellows 110 must be attached to the cooling module 108 to establish a seal between the bellows 110 and the module 108. In a high density packaging environment, accessing the fasteners which are used to attach bellows 110 to the module 108 and to tighten the seal between these elements is very difficult. Further, special tools are required to disconnect the module 108 from the wiring substrate 100.

Further drawbacks of this conventional structure are (1) that the low axial flexibility of the bellows 110 makes it difficult to use a collective assembly or disassembly process, and (2) the failure to protect the solder terminals 104 and the wiring substrate 100 from mechanical stresses during the assembling or disassembling process.

SUMMARY OF THE INVENTION

It is, therefore, an object of the present invention to provide a cooling system for heat-generating devices which utilizes elements having flexibility or elasticity in the radial direction to absorb misalignment tolerances between coolant chambers thermally jointed to heat-generating devices, which are mounted on an electrical interconnect structure, and a hydraulic interconnect structure.

Another object of the present invention is to provide a cooling system for heat-generating devices which allows the hydraulic connections between the coolant chambers and the hydraulic interconnection structure to be connected (assembled) and disconnected (disassembled) in a collective process.

Another object of the present invention is to provide a method for assembling and disassembling a liquid-cooled assembly of heat-generating devices which protects the connections between the heat-generating devices and the electrical interconnect structure from mechanical forces during the assembly and disassembly processes.

Another object of the present invention is to provide a liquid-cooled assembly of heat-generating devices in which the connections between the coolant chamber and the hydraulic interconnect structure do not require tightening on assembly and loosening on disassembly.

A further object of the present invention is to provide a liquid-cooled assembly of heat-generating devices in which the heat-generating devices are integrated circuits, and in which the cooling chamber may be an integral element of the integrated circuit package or a separate component.

These and other objects of the present invention are accomplished by providing an assembly having heat-generating devices mounted on an electrical interconnect structure, coolant chambers thermally jointed to corresponding ones of the heat-generating devices, a hydraulic interconnect structure detachably connected to the electrical interconnect structure, coolant chamber-to-coolant chamber connectors ("first connectors", coolant chamber-to-hydraulic interconnect structure connectors ("second connectors"), and flexible tubular members interconnecting the coolant chambers of the heat-generating devices to the first connectors and to the second connectors. The flexibility of the tubular members is in the radial (lateral) direction rather than the axial (longitudinal) direction. The heat-generating device may be, for example, an integrated circuit package, and the flexible tubular members may be formed as flexible plastic nipples which are an integral portion of the cooling chamber jointed to the integrated circuit package.

A liquid-cooled assembly of heat-generating devices in accordance with present invention, comprises: electrical interconnect means; one or more heat-generating devices, each heat-generating device having electrical contacts connected to said electrical interconnect means; one or more coolant chambers, thermally jointed with corresponding ones of said one or more heat generating devices, each of said coolant chambers having an inlet and an outlet; and hydraulic means for providing coolant to said coolant inlets of said one or more coolant chambers and removing coolant from said coolant outlets of said one or more coolant chambers, said inlets and said outlets of said coolant chambers being tubular members having sufficient radial flexibility and axial rigidity for assembling in a collective process.

A method, in accordance with the present invention, for assembling a liquid-cooled assembly of heat-generating devices in a collective process, the assembly including means for electrically interconnecting the heat-generating devices, coolant chambers thermally jointed with corresponding ones of the heat-generating devices, each coolant chamber having an inlet and an outlet, the inlets and outlets of the coolant chambers being tubular members having axial rigidity and radial flexibility, and hydraulic means, having a coolant inlet and a coolant outlet, for hydraulically interconnecting and providing coolant to the inlets of the coolant chambers and removing coolant from the outlets of the coolant chambers, the hydraulic means having passages for receiving the tubular members, and sealing means for providing radially compressed seals between the tubular members and the passages, comprises the sequential steps of: (a) inserting the tubular members into the passages without forming radially compressed seals; (b) plugging the coolant outlet of the hydraulic means; and (c) applying a vacuum to the coolant inlet of the hydraulic means so that the sealing means provide radially compressed seals between the tubular members and the passages.

DESCRIPTION OF THE PREFERRED EMBODIMENTS

A liquid-cooled assembly of heat-generating devices, in accordance with the present invention, will be described with reference to FIGS. 2-6.

Figure 1:
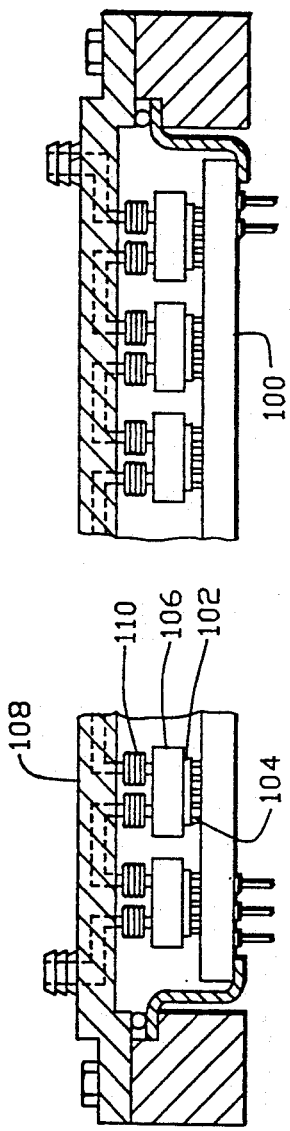
FIG. 1 is a partial sectional view of a conventional liquid-cooled assembly of heat-generating devices.
Figure 2:
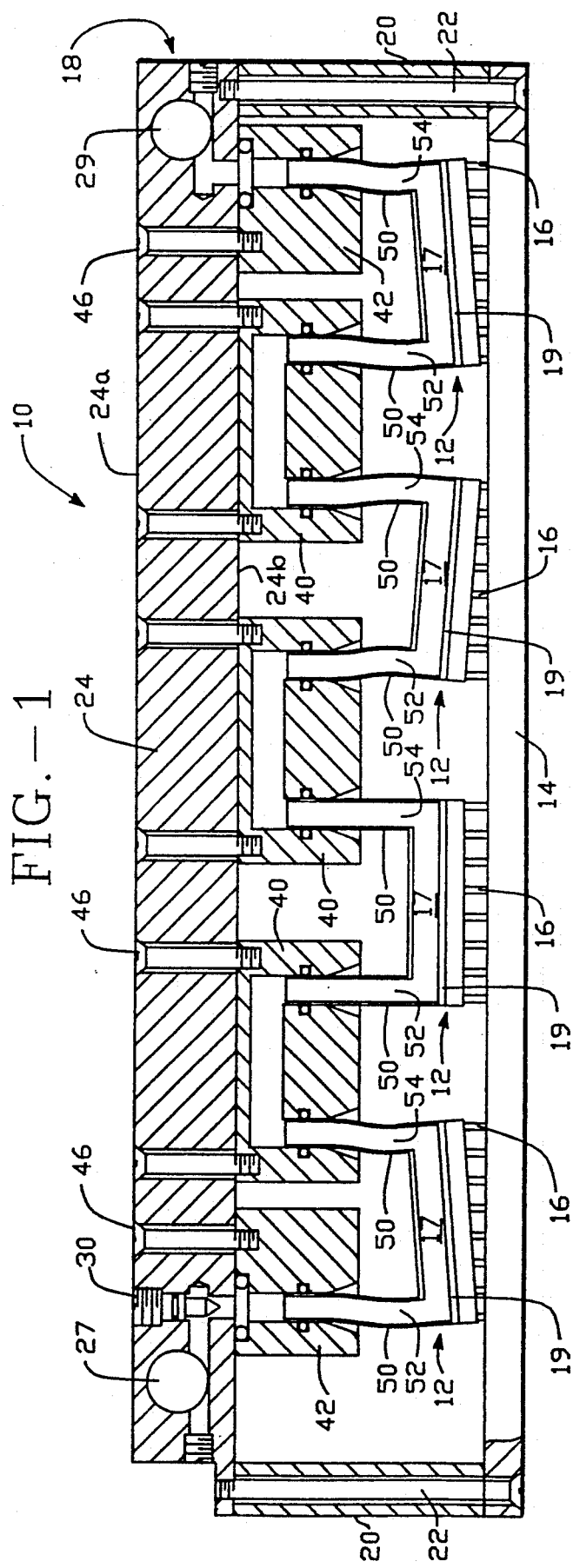
FIG. 2 is a schematic side view of a liquid-cooled assembly of heat-generating devices in accordance with the present invention.
Figure 3:
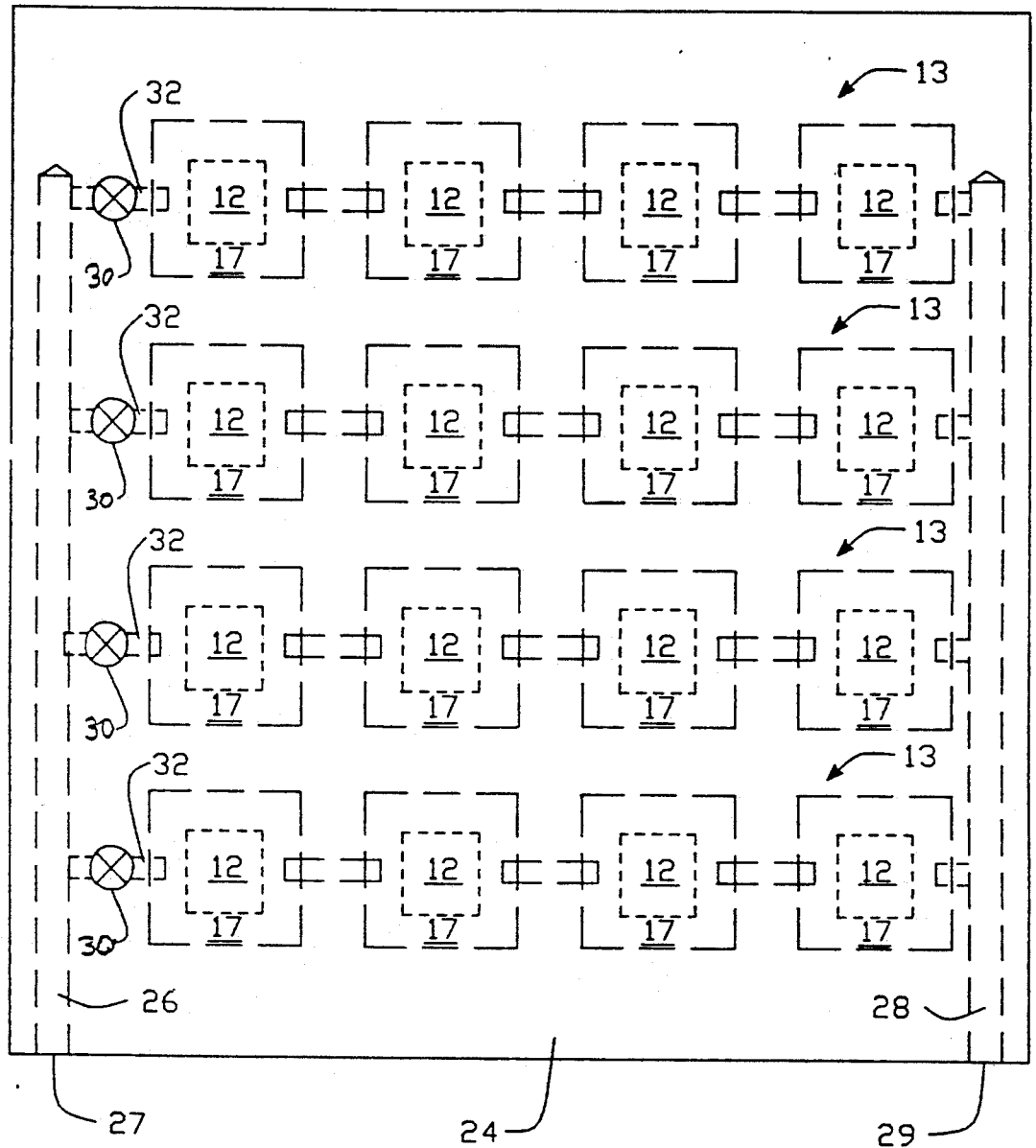
FIG. 3 is a schematic plan view of an assembly showing a plurality of heat-generating devices in a two-dimensional array having multiple rows.

FIG. 2 is a schematic side view of an assembly 10 for cooling a plurality of heat-generating devices 12, and FIG. 3 is a schematic plan view of the assembly 10. Heat-generating devices 12, which are arranged in one or more rows 13, are electrically and mechanically connected by an electrical interconnect means. The electrical interconnect means includes an electrical interconnect structure 14, e.g., a printed circuit board, and contacts or connectors 16 which connect devices 12 to the electrical interconnect structure 14. Each heat-generating device 12 is thermally jointed to a corresponding coolant chamber 17 by a thermal joint 19.

A hydraulic interconnect means 18 is mounted on electrical interconnect structure 14 by spacers 20 and fasteners 22. Hydraulic interconnect means 18 includes a manifold 24 having a coolant inlet channel 26 with an inlet 27, a coolant outlet channel 28 with an outlet 29, and flow control mechanisms 30 to control the flow of coolant between the inlet channel 28 and coolant passages 32. Coolant passages 32 supply coolant to the rows 13 of coolant chambers 17 thermally jointed to corresponding heat-generating devices 12. Each flow control mechanism 30 customizes the flow of coolant provided to a row 13, depending on the amount of heat which must be dissipated from the heat-generating devices in the particular row 13. Coolant is provided to rows 13 by passages 32 in parallel, and coolant passes from coolant chamber 17 to coolant chamber 17 in series.

Hydraulic interconnect means 18 also includes first connectors 40, and second connectors 42. First connectors 40 may be secured to manifold 24 and second connectors 42 are secured to manifold 24 by fasteners 46. Fasteners 46 are accessed from the portion of the manifold 24 which faces away from electrical interconnect structure 14 and heat-generating devices 12, thereby facilitating access to fasteners 46. First connectors 40 are not hydraulically connected to manifold 24. Tubular members 50, connectors 40, 42, and manifold 24 provide a closed path for coolant flowing between coolant chambers 17.

Tubular members 50 function as a coolant inlet 52 and a coolant outlet 54 for the coolant chambers 17. First connectors 40 interconnect the coolant inlet 52 of one chamber 17 with the coolant outlet 54 of an adjacent chamber 17. One second connector 42 interconnects the coolant inlet 52 of the chamber 17 at one end of a row 13 to coolant inlet channel 26 of manifold 24 via coolant passage 32. The other second connector 42 interconnects the coolant outlet 54 of the chamber 17 at the other end of the row 13 to the coolant outlet channel 28 of manifold 24.

Figure 4:
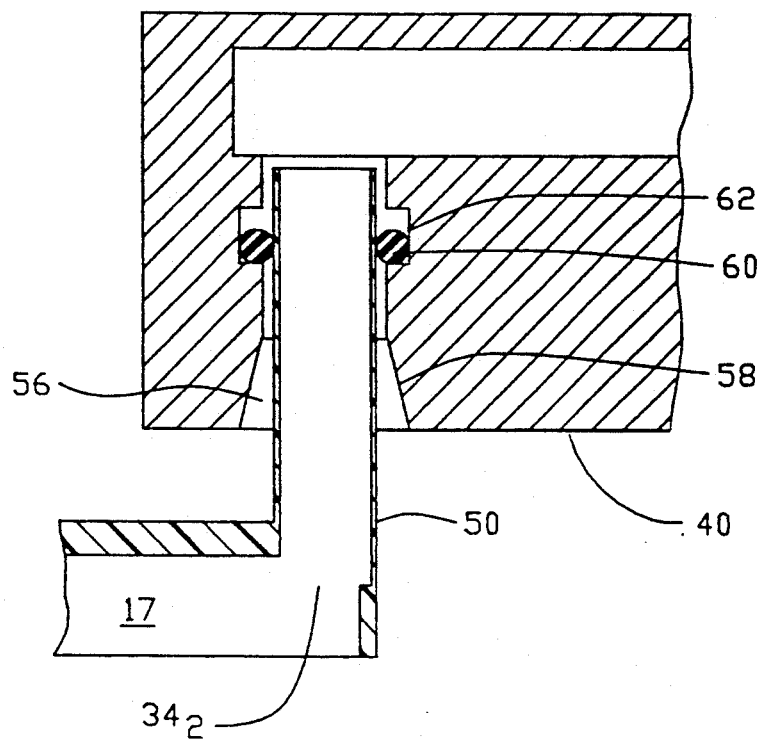
FIG. 4 is sectional view of portion of a manifold connector of the assembly of the present invention.

With reference to FIG. 4, coolant chamber-to-coolant chamber connectors ("first connectors") 40 and coolant chamber-to-hydraulic interconnect structure connectors ("second connectors 42") have passages 56, each passage 56 being designed to receive a tubular member 50. To facilitate assembly of the tubular members 50 with first connectors 40 and second connectors 42, passages 56 have chamfered openings 58. Once a member 50 passes the chamfered opening 58, it encounters an o-ring 60. The o-ring 60 is installed in a groove 62 and provides a radially compressed seal between member 50 and passage 56. An o-ring is one example of a radially compressible seal between a member 50 and connectors 40. 42. Another example is a U-seal.

Figure 5:
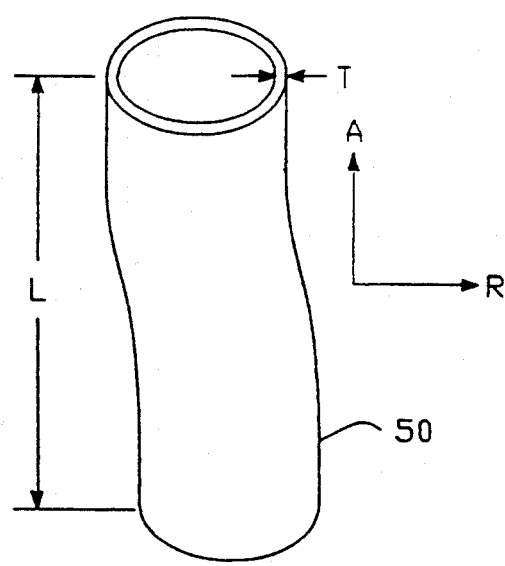
FIG. 5 is a schematic view of a flexible, tubular member in accordance with the present invention.
Figure 6:
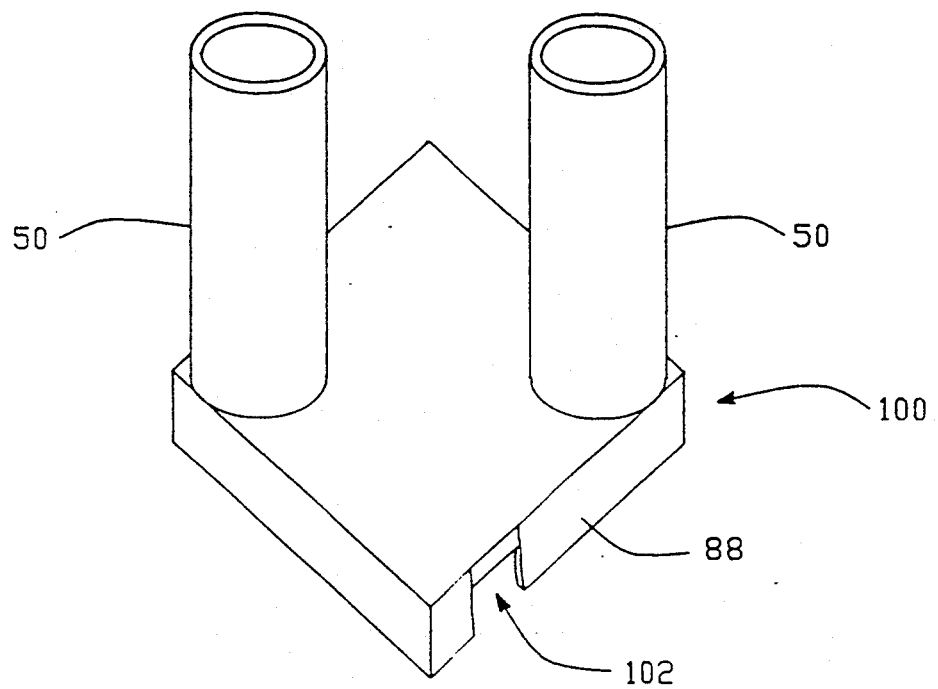
FIG. 6 is an isometric, partial cut-away view of a jacket which includes flexible tubular members in accordance with the present invention.

Members 50, shown in FIG. 5, are formed of plastic. Alternative materials for members 50 include rubber and flexible metal sleeves. The particular plastic selected for members 50 depends on the bonding technique used to attach the members 50 to the coolant chamber 17. If members 50 are constructed as part of a cooling jacket 100, as shown in FIG. 6, the member 50 may be constructed of, for example, a thermoplastic resin such as Mindel A670.

The flexible nature of members 50 allows alignment tolerances caused by imperfect location and orientation of the chambers 17 to be absorbed without significant bending stress. Members 50 are flexible in a radial (or lateral) direction, indicated as the direction R (FIG. 5). However, members 50 are generally not flexible in the axial (or longitudinal) direction indicated as the direction A. The radial flexibility of members 50 provides a lateral deflection of at least ±0.005". This flexibility depends on the length L of the member 50 and the wall thickness T of the member. In one embodiment of the invention, the members 50 have a length L of approximately 0.75" and a wall thickness T of approximately 0.020". The radial flexibility of members 50 should be sufficient to compensate for the misalignment of cooling chambers 17 and manifold 24, which are nominally aligned.

The radial flexibility and axial rigidity of members 50 facilitates assembling and disassembling of assembly 10 of heat generating devices 12 in a collective process. A collective process involves the simultaneous engagement or disengagement of a plurality of hydraulic connections. In assembling the assembly 10, members 50 are inserted into connectors 40 and 42 without applying downward pressure to connectors 40 and 42. This inserting process places members 50 in contact with o-rings 60. Then, the coolant outlet 29 of manifold 24 is plugged and a vacuum is applied to the coolant inlet 27. The vacuum draws the members 50 into connectors 40 and 42 so that members 50 engage o-rings 60. Utilizing a vacuum for assembling in the manner described avoids applying pressure to and therefore avoids damaging contacts 16. After members 50 are properly seated with o-rings 60, connectors 40 and 42 may be secured to bottom 24b of manifold 24. Conversely, air pressure may be used in a disassembling operation by plugging outlet 29 and applying air pressure at the inlet 27. The air pressure in the coolant passage forces members 50 to separate from o-rings 60 without stressing contacts 16.

The holes in manifold 24 for fasteners 46 are slightly oversized so that the position of connectors 40 and 42 is adjustable with respect to the manifold 24. Fasteners 46 are accessible from the top 24a of manifold 24. In the first assembling operation of the assembly 10, this adjustability is used to position the connectors 40 and 42 so that subsequent assembly operation may be conducted without detaching the connectors 40 and 42 from manifold 24.

In one embodiment of the present invention, heat-generating devices 12 may be integrated circuits; the integrated circuits may be in packages or unpackaged. One example of a package for such an integrated circuit is described in co-pending application Ser. No. 426,093, filed Oct. 24, 1989, which is hereby incorporated by reference.

FIG. 6 shows an example of a cooling jacket 100 for use with an integrated circuit package. A jacket 100 combines members 50 and a cover 88 in an integral element. Cover 88 has a cavity 102 which forms a coolant chamber 17 when jacket 100 is attached to a package containing heat-generating device 12 (an integrated circuit) in a manner which seals coolant chamber 17 for the specific coolant selected. Those of ordinary skill in the art will understand that different coolants may require different sealing techniques.

What is claimed is:

1. A liquid-cooled assembly of heat-generating devices, comprising:
   electrical interconnect means;
   a plurality of heat-generating devices, each said heat-generating device having electrical contacts connected to said electrical interconnect means;
   a plurality of coolant chambers, each said coolant chamber being thermally jointed with a corresponding one of said heat generating devices, each said coolant chamber having an inlet and an outlet; and
   hydraulic means, detachably and hydraulically connected to said coolant inlets and said coolant outlets of said coolant chambers, for providing coolant to said coolant inlets of said coolant chambers and removing coolant from said coolant outlets of said coolant chambers,
   said inlets and said outlets of said coolant chambers being tubular members having sufficient radial flexibility and axial rigidity so that said plurality of tubular members can be connected with said hydraulic means in a collective process.

2. A liquid-cooled assembly of heat-generating devices according to claim 1, wherein said hydraulic means comprises a plurality of passages for receiving corresponding ones of said tubular members, and radially compressed hydraulic seals between said passages and said corresponding ones of said tubular members.

3. A liquid-cooled assembly of heat-generating devices, comprising:
   electrical interconnect means;
   a plurality of heat-generating devices, each said heat-generating device having electrical contacts connected to said electrical interconnect means;
   a plurality of coolant chambers, each said coolant chamber being thermally jointed with a corresponding, respective one of said heat generating devices and having an inlet and an outlet, said inlets and said outlets of said coolant chambers being tubular members having sufficient radial flexibility and axial rigidity for assembling in a collective process; and
   hydraulic means for providing coolant to said coolant inlets of said coolant chambers and removing coolant from said coolant outlets of said coolant chambers, said hydraulic means comprising:
   a manifold having a coolant inlet and a coolant outlet,
   a plurality of first connectors providing coolant paths between said tubular members of corresponding ones of said coolant chambers, and
   at least two second connectors providing a coolant path between one tubular member and said coolant inlet and between one tubular member and said coolant outlet.

4. A liquid-cooled assembly of heat-generating devices according to claim 3, wherein said tubular members are formed as integral parts of said coolant chambers.

5. A liquid-cooled assembly of heat-generating devices according to claim 2, wherein said radially compressed hydraulic seals are O-rings.

6. A liquid-cooled assembly of heat-generating devices according to claim 3, wherein:
   said manifold has first and second opposed sides;
   said hydraulic means further comprises fasteners for attaching said first connectors and said second connectors to said first side of said manifold, said fasteners being accessible from said second side of said manifold.

7. A liquid-cooled assembly of heat-generating devices according to claim 3, wherein:
   said plurality of heat generating devices are arranged in rows;
   said hydraulic means provides coolant to said coolant chambers of each said row of heat-generating devices in parallel; and
   said first and second connectors provide coolant to said coolant chambers in each said row in series.

8. A liquid-cooled assembly of heat-generating devices according to claim 3, wherein:
   said plurality of heat-generating devices are arranged in rows, each row including N heat-generating devices;
   N−1 first connectors provide coolant paths between said tubular members of said coolant chambers associated with each row of heat-generating devices; and said hydraulic means comprises two second connectors for each row of heat-generating devices.

9. A liquid-cooled assembly of heat-generating devices according to claim 3, wherein said first and second connectors comprise passages for receiving corresponding ones of said tubular members and radially compressed hydraulic seals between said passages and corresponding ones of said tubular members.

10. A liquid-cooled assembly of heat-generating devices according to claim 9, wherein each said first and second connector comprises two hydraulically connected passages, and said radially compressed hydraulic seals comprise an o-ring provided in each said opening.

11. A liquid-cooled assembly of integrated circuit packages, comprising:
electrical interconnect means;
a coolant supply manifold having a coolant inlet and a coolant outlet;
a plurality of integrated circuit packages, each said integrated circuit package comprising:
an integrated circuit, and
means for electrically interconnecting the integrated circuit to said electrical interconnect means;
a plurality of coolant chambers thermally jointed with respective ones of said integrated circuit packages;
a plurality of tubular members, each tubular member having radial flexibility and axial rigidity, said tubular members forming inlets and outlets of said plurality of coolant chambers;
a plurality of first connectors, each said first connector hydraulically connecting said outlet of one of said cooling chambers with the inlet of another one of said cooling chambers;
a second connector for hydraulically connecting one of said tubular members and said coolant outlet of said coolant supply manifold; and
a third connector for hydraulically connecting one of said tubular members and said coolant inlet of said coolant supply manifold.

12. A liquid-cooled assembly according to claim 11, wherein said tubular members are formed as an integral part of said coolant chambers.

13. A liquid-cooled assembly according to claim 11, wherein each of said plurality of first connectors, said second connector, and said third connector are attached to said coolant supply manifold so that said connectors move in the radial direction of said tubular members to provide alignment of said connectors and said tubular members.

14. A liquid-cooled assembly according to claim 11, wherein:
said plurality of integrated circuit packages are arranged in rows of N integrated circuit packages;
N−1 first connectors hydraulically connect said outlet of one of said cooling chambers with the inlet of another one of said cooling chambers of said N integrated circuit packages in each of said rows of integrated circuit packages, further comprising:
a second connector for each of said rows of integrated circuit packages; and
a third connector for each of said rows of integrated circuit packages.

15. A liquid-cooled assembly of heat-generating devices, comprising:
a support structure;
N heat-generating devices mounted on said support structure;
N coolant chambers, each coolant chamber being thermally jointed to a corresponding one of said heat-generating devices;
2N flexible tubular members, N of said flexible tubular members providing inlets for respective ones of said coolant chambers and N of said flexible tubular elements providing outlets for respective ones of said coolant chambers, each flexible tubular member being constructed to have radial flexibility and axial rigidity; and
a hydraulic interconnect structure detachably connected to said support structure, said hydraulic interconnect structure comprising:
a manifold having a coolant inlet and a coolant outlet,
a plurality of first connectors providing coolant paths between the flexible tubular members associated with respective coolant chambers,
at least two second connectors providing a coolant path between one flexible tubular member and said coolant inlet of said manifold and between one flexible tubular member and said coolant outlet of said manifold, and
sealing means for providing radially compressed hydraulic seals between said tubular members and corresponding ones of said first and second connectors.

16. A liquid-cooled assembly of heat-generating devices according to claim 15, wherein each said first connector has two hydraulically connected openings, each said opening being adapted to receive a flexible tubular member, and said sealing means comprises an o-ring provided in each said opening.

17. A liquid-cooled assembly of heat-generating devices according to claim 15, wherein said first and second connectors are detachably connected to said manifold.

18. A liquid-cooled assembly of heat-generating devices according to claim 15, wherein:
said plurality of heat-generating devices are arranged in rows; and
said manifold comprises means for transferring coolant from said coolant inlet to said coolant chambers of each of said rows of heat-generating devices, and means for adjusting the amount of coolant flowing to said coolant chambers of each row of heat-generating devices.

19. A method for assembling a liquid-cooled assembly of heat-generating devices in a collective process, the assembly including means for electrically interconnecting the heat-generating devices, coolant chambers thermally jointed with corresponding ones of the heat-generating devices, each coolant chamber having an inlet and an outlet, the inlets and outlets of the coolant chambers being tubular members having axial rigidity and radial flexibility, and hydraulic means, having a coolant inlet and a coolant outlet, for hydraulically interconnecting and providing coolant to the inlets of the coolant chambers and removing coolant from the outlets of the coolant chambers, the hydraulic means having passages for receiving the tubular members, and sealing means for providing radially compressed seals between the tubular members and the passages, comprising the sequential steps of:

(a) inserting the tubular members into the passages without forming radially compressed seals;
(b) plugging the coolant outlet of the hydraulic means; and
(c) applying a vacuum to the coolant inlet of the hydraulic means so that the sealing means provide radially compressed seals between the tubular members and the passages.

20. A method for assembling a liquid-cooled assembly of heat-generating devices according to claim 19, wherein said step (a) comprises the sub-step of placing the tubular members in contact with the sealing means without creating radial compressed seals.

21. A method for disassembling a liquid-cooled assembly of heat-generating devices in a collective process, the assembly including means for electrically interconnecting the heat-generating devices, coolant chambers thermally jointed with corresponding ones of the heat-generating devices, each coolant chamber having an inlet and an outlet, the inlets and outlets of the coolant chambers being tubular members having axial rigidity and radial flexibility, and hydraulic means having a coolant inlet and a coolant outlet for hydraulically interconnecting and providing coolant to the inlets of the coolant chambers and removing coolant from the outlets of the coolant chambers, the hydraulic means having passages for receiving the tubular members, and sealing means for providing radially compressed seals between the tubular members and the passages, comprising the sequential steps of:
(a) plugging the coolant outlet of the hydraulic means; and
(b) applying air pressure to the coolant inlet of the hydraulic means so that the tubular members disengage from the sealing means.

* * * * *